US008909065B2

(12) United States Patent
Henzler

(10) Patent No.: US 8,909,065 B2
(45) Date of Patent: Dec. 9, 2014

(54) ADJUSTABLE DELAYER, METHOD FOR DELAYING AN INPUT SIGNAL AND POLAR TRANSMITTER

(75) Inventor: Stephan Henzler, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 650 days.

(21) Appl. No.: 13/184,171

(22) Filed: Jul. 15, 2011

(65) Prior Publication Data

US 2013/0016982 A1 Jan. 17, 2013

(51) Int. Cl.
*H04B 10/04* (2006.01)
*H03H 11/26* (2006.01)

(52) U.S. Cl.
CPC .................................. *H03H 11/265* (2013.01)
USPC ............................ 398/184; 398/183; 398/188

(58) Field of Classification Search
CPC ............... H04B 10/532; H04B 10/505; H04Q 11/0066; H04Q 11/0005
USPC ................................... 398/53, 183–184, 188
See application file for complete search history.

(56) References Cited

U.S. PATENT DOCUMENTS

| 7,480,344 B2 * | 1/2009 | Zolfaghari et al. ........... 375/297 |
| 7,940,098 B1 | 5/2011 | Kwasniewski et al. |
| 2006/0188051 A1 * | 8/2006 | Donnelly et al. ............. 375/371 |
| 2006/0197567 A1 | 9/2006 | Jakobs et al. |
| 2008/0037662 A1 * | 2/2008 | Ravi et al. ..................... 375/260 |
| 2009/0054013 A1 | 2/2009 | Seo et al. |
| 2012/0177094 A1 * | 7/2012 | Chang et al. .................. 375/224 |

FOREIGN PATENT DOCUMENTS

| CN | 1608342 A | 4/2005 |
| CN | 101145779 A | 3/2008 |

* cited by examiner

*Primary Examiner* — Dzung Tran
(74) *Attorney, Agent, or Firm* — Eschweiler & Associates, LLC

(57) ABSTRACT

An adjustable delayer for adjustably delaying an input signal based on a delay adjustment input information describing a desired delay includes a plurality of series-connected tunable delay circuits, wherein a first of the tunable delay circuits is configured to receive the input signal. The adjustable delayer also includes a closed-loop control circuit configured to provide a first delay tuning information to tune a combined delay of the plurality of tunable delay circuits to fulfill a predetermined condition. The adjustable delayer also includes a combiner to combine the first delay tuning information with a second delay tuning information, that is based on the delay adjustment input information, to obtain a combined delay tuning information. The adjustable delayer is configured to tune a delay of one or more of the tunable delay circuits based on the combined delay tuning information. The adjustable delayer is configured to provide the output signal based on one or more signals present at outputs of one or more of the adjustable delay circuits.

33 Claims, 9 Drawing Sheets

ADJUSTABLE DELAYER, METHOD FOR DELAYING AN INPUT SIGNAL AND POLAR TRANSMITTER

FIELD

Embodiments according to the invention are related to an adjustable delayer for adjustably delaying an input signal based on a delay adjustment input information describing a desired delay, to obtain an output signal. Further embodiments according to the invention are related to a method for delaying an input signal based on a delay adjustment input information describing a desired delay, to obtain a delayed output signal. Further embodiments according to the invention are related to a polar transmitter. Some embodiments according to the invention are related to a digital-to-time converter (DTC).

BACKGROUND

The provision of a phase modulated signal, or the phase modulation of an existing signal, is used in many applications. For example, phase modulation is used in so-called polar transmitters.

In view of this situation, there is a desire to have a concept for the provision of a phase modulated signal which comprises good characteristics.

SUMMARY

An embodiment according to the invention creates an adjustable delayer for adjustably delaying an input signal based on a delay adjustment input information describing a desired delay, to obtain an output signal. The adjustable delayer comprises a series connection of a plurality of tunable delay circuits, wherein a first of the tunable delay circuits is configured to receive the input signal. The adjustable delayer also comprises a closed-loop control circuit (also designated as a regulation circuit) configured to provide a first delay tuning information, to tune a combined delay of the plurality of tunable delay circuits to fulfill a predetermined condition. The adjustable delayer also comprises a combiner configured to combine the first delay tuning information with a second delay tuning information, which is based on the delay adjustment input information, to obtain a combined delay tuning information. The adjustable delayer is configured to tune a delay of one or more of the tunable delay circuits based on the combined delay tuning information. The adjustable delayer is configured to provide the output signal based on one or more signals present at one or more outputs of one or more of the adjustable delay circuits.

Another embodiment according to the invention creates a method for delaying an input signal based on a delay adjustment input information describing a desired delay, to obtain an output signal. The method comprises providing a first delay tuning information to tune a combined delay of a plurality of tunable delay circuits, that are connected in series, to fulfill a predetermined condition. The method also comprises combining the first delay tuning information with a second delay tuning information, that is based on the delay adjustment input information, to obtain a combined delay tuning information. The method also comprises tuning a delay of one or more of the tunable delay circuits based on the combined delay tuning information. The output signal is obtained on the basis of the input signal using one or more of the tunable delay circuits tuned based on the combined delay tuning information.

Another embodiment according to the invention creates an adjustable delayer for adjustably delaying an input signal based on a delay adjustment input information describing a desired delay, to obtain an output signal. The adjustable delayer comprises a delay line comprising a first sub-delay line and a second sub-delay line connected in series. The adjustable delayer also comprises a delay locked loop, wherein the first sub-delay line and the second sub-delay line are included in the delay locked loop. A closed-loop control circuit is configured to provide a first delay tuning signal to change delays of the first sub-delay line and of the second sub-delay line in the same direction in response to a deviation of an actual phase shift between a reference signal and an output signal of the second sub-delay line from a predetermined target phase shift. The adjustable delayer also comprises a signal provider configured to provide a second delay tuning signal and a third delay tuning signal to change delays of the first sub-delay line and of the second sub-delay line in opposite directions based on the delay adjustment input information (e.g., in response to a change of the delay adjustment input information). The first sub-delay line is configured to receive the input signal. Moreover, the adjustable delayer is configured to provide the output signal on the basis of an output signal of the first sub-delay line or on the basis of a signal at a tap of the first sub-delay line. The adjustable delayer my be also configured to provide the output signal on the basis of an output signal of the second sub-delay line or on the basis of a signal at a tap of the second sub-delay line.

Another embodiment according to the invention creates a polar transmitter for providing a phase modulated output signal based on a phase modulation information. The polar transmitter comprises an oscillator configured to provide an unmodulated carrier signal. The polar transmitter also comprises an adjustable delayer, as described above. The adjustable delayer is configured to receive the unmodulated carrier signal as the input signal. Moreover, the adjustable delayer is configured to receive the phase modulation information as the second delay tuning information or to derive the second delay tuning information from the phase modulation information. The output signal of the adjustable delayer is the phase modulated output signal.

Another embodiment according to the invention creates a polar transmitter for providing a phase modulated output signal based on a phase modulation information. The polar transmitter comprises a variable phase oscillator configured to provide an incompletely modulated signal, wherein the variable phase oscillator is configured to adjust a phase of the incompletely modulated signal based on the phase modulation information or based on a component of the phase modulation information. The polar transmitter also comprises an adjustable delayer for adjustably delaying the incompletely modulated signal based on the phase modulation information or based on a component of the phase modulation information, to obtain the phase modulated output signal.

BRIEF DESCRIPTION OF THE DRAWINGS

Embodiments according to the invention will subsequently be described taking reference to the enclosed figures, in which.

DETAILED DESCRIPTION

In the following, an adjustable delayer according to FIG. 1 will be described.

Figure 1:
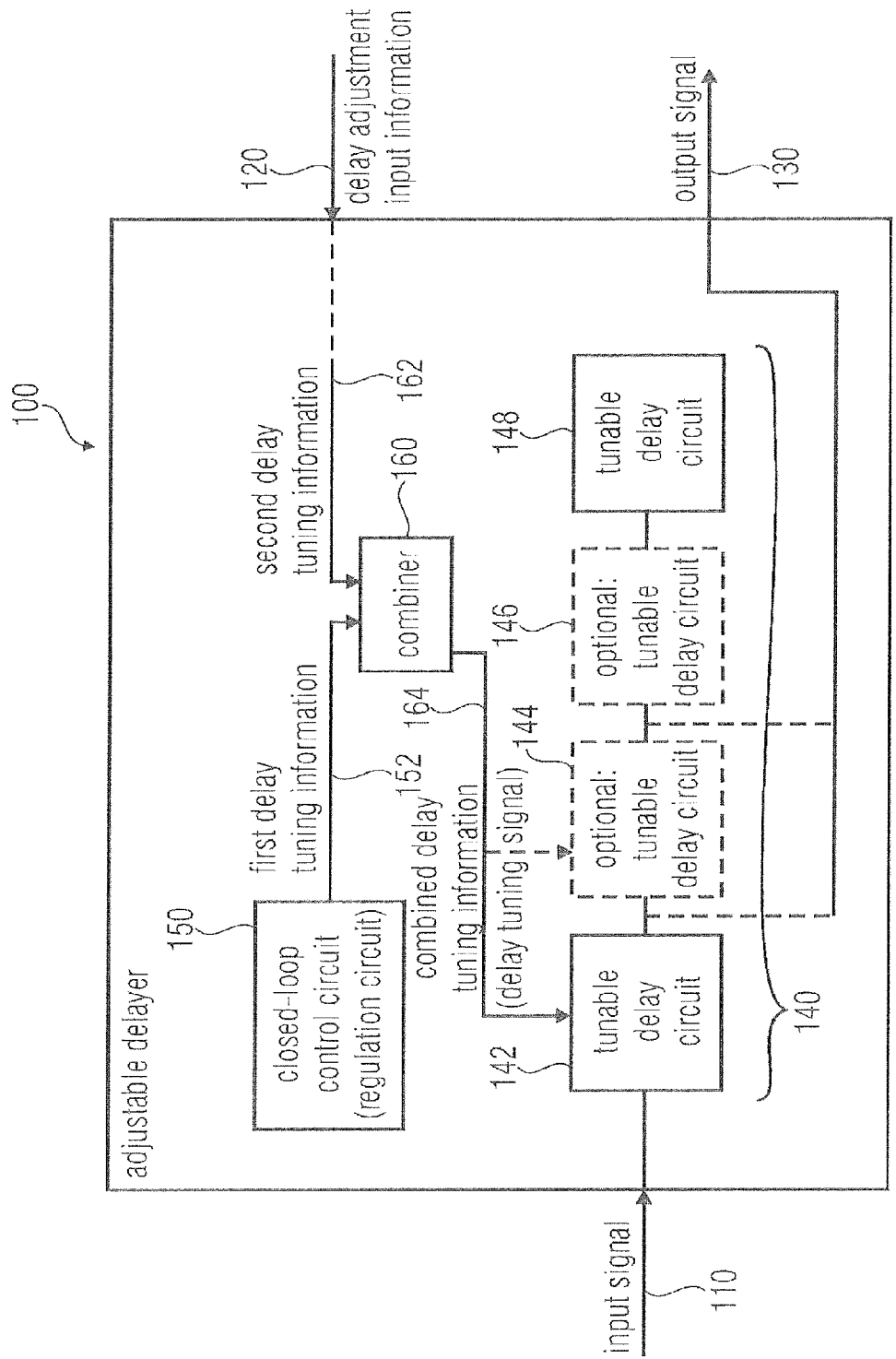
FIG. 1 shows a block schematic diagram of an adjustable delayer, according to an embodiment of the invention.

FIG. 1 shows a block schematic diagram of an adjustable delayer 100 for delaying an input signal 110 based on a delay adjustment input information 120 describing a desired delay, to obtain an output signal 130 which may, for example, be delayed with respect to the input signal 110.

The adjustable delayer 100 comprises a series connection 140 of a plurality of tunable delay circuits 142, 144, 146, 148 (wherein there may be more or less tunable delay circuits). A first tunable delay circuit 142 of the plurality of tunable delay circuits 142, 144, 146, 148 is configured to receive the input signal 110 (or, equivalently, a signal derived from the input signal 110). The adjustable delayer also comprises a closed-loop control circuit 150 that is configured to provide a first delay tuning information 152 to tune a combined delay of the plurality 140 of tunable delay circuits 142, 144, 146, 148 to fulfill a predetermined condition. The adjustable delayer 100 also comprises a combiner 160 configured to combine the first delay tuning information 152 (which may, for example, take the form of a digital number representation) with a second delay tuning information 162, which may, for example, take the form of a digital number representation, and which is based on the delay adjustment input information 120 (or, equivalently, identical to the delay adjustment input information 120), to obtain a combined delay tuning information 164 (which may, for example, take the form of a digital number representation or of an analog signal). The adjustable delayer 100 is configured to tune a delay of one or more of the tunable delay circuits (for example, of the tunable delay circuits 142, 144) based on the (first) combined delay tuning information 164. Moreover, the adjustable delayer 100 is configured to provide the output signal 130 based on one more signals present at one or more outputs of one or more of the tunable delay circuits 142, 144, 146, 148.

In the following, the functionality of the adjustable delayer 100 will be briefly discussed.

It should be noted here that the tunable delay circuits 142, 144, . . . , 148 allow for adjustably delaying the input signal, to derive the output signal 130 such that the output signal 130 is a delayed version of the input signal 110. However, it has been found that the delay of the tunable delay circuits 142, 144, . . . , 148 typically varies over the environmental conditions (like, for example, supply voltage and temperature) and also varies across different devices (for example, because of process variations). However, it has also been found that the use of a closed loop control circuit 150, which (for example, permanently or periodically) updates the first delay tuning information 152, to tune a combined delay of the plurality of tunable delay circuits to fulfill a predetermined condition, allows for a compensation of such changes of the delay of the individual tunable delay circuits 142, 144, . . . , 148 over temperature, supply voltage and also over devices from different processes. It has been recognized that by combining the second delay tuning information 162, which in one embodiment describes desired dynamic changes of the delay between the input signal 110 and the output signal 130, with the first delay tuning information 152, that provides an appropriate "bias" information to compensate for changes of the delay of the tunable delay circuits 142, 144, . . . , 148, due to temperature changes, supply voltage changes and process variations, a very well-controlled delay between the input signal 110 and the output signal 130 can be obtained.

To summarize the above, the adjustable delayer 100 allows for the provision of a very well-defined delay between the input signal 110 and the output signal 130 even in the presence of significant changes of the operation conditions (for example, temperature and supply voltage), as the closed-loop control circuit 150 provides the first delay tuning information 152 to compensate for such changes by tuning a combined delay of the plurality of tunable delay circuits to fulfill a predetermined condition. The desired delay variation is caused by the second delay tuning information 160, which is overlaid, using the combiner, to the "bias" defined by the first delay tuning information 152.

In the following, some optional improvements of the adjustable delayer 100 will be discussed.

In an embodiment, the adjustable delayer is (optionally) configured to tune a first subset of the tunable delay circuits (for example, the first tunable delay circuit 142 and the second tunable delay circuit 144) and a second subset of the tunable delay circuits (for example, the third tunable delay circuit 146 and the fourth tunable delay circuit 148) such that delays of the tunable delay circuits 142, 144 of the first subset increase with increasing values of the second delay tuning information 162 (which describes desired delay variations) and such that delays of the tunable delay circuits 146, 148 of the second subset reduce with increasing values of the second delay tuning information 162 in the presence of a constant first delay tuning information 152. In other words, combined delay tuning signals (for example, the combined delay tuning information 164 and another combined delay tuning information not shown in FIG. 1) may be provided to the tunable delay circuits 142, 144 of the first subset and to the tunable delay circuits 146, 148 of the second subset, wherein the combined delay tuning signal provided to the tunable delay circuits 142, 144 may change in an opposite direction when compared to the combined delay tuning signal provided to the tunable delay circuits 146, 148 of the second subset in response to a variation of the second delay tuning information. Both the combined delay tuning signal 164 provided to the tunable delay circuits 142, 144 of the first subset and the additional combined delay tuning signal (not shown in FIG. 1) provided to the tunable delay circuits 146, 148 of the second subset may, for example, be provided using the combiner 160. However, alternatively, another combiner (not shown in FIG. 1) may be used to provide the combined delay tuning signal provided to the tunable delay circuits 146, 148 of the second subset.

By varying the delays of the tunable delay circuits 142, 144 of the first subset and the delays of the tunable delay circuits 146, 148 of the second subset in different directions in response to a change of the second delay tuning information 162, it can be achieved that a delay variation of the tunable delay circuits 142, 144 of the first subset, which delay variation is caused by the change of the second delay tuning information 162, is, at least partly or within a predetermined tolerance range, compensated by an opposite delay variation of the tunable delay circuits 146, 148 of the second subset, which is also caused by said change of the second delay tuning information 162. Accordingly, it can be achieved that an overall delay (also designated as a combined delay) of the series connection of the tunable delay circuits 142, 144 of the first subset and of the tunable delay circuits 146, 148 of the second subset, remains at least approximately constant even for a variation of the second delay tuning information 162, because an increase of the delays of the tunable delay circuits 142, 144 of the first subset is, at least approximately, compensated by a decrease of the delays of the tunable delay circuits 146, 148 of the second subset. Accordingly, the regulation of the overall delay of said series connection, that is performed using the closed-loop control circuit 150, is almost unaffected by changes of the second delay tuning information 162. Accordingly, the closed loop control of the combined delay (also designated as overall delay) can be active even when the second delay tuning information 162 changes without seriously degrading the functionality of the circuit. Worded differently, the closed loop control of the combined delay of the series circuit 140 does not disturb a variation of the delay of the tunable delay circuits 142, 144 of the first subset, which delay variation is caused by a change of the second delay tuning formation 162. Thus, in some embodiments it is possible to simultaneously and independently regulate the combined delay of the series connection to fulfill a predetermined condition while changing the delays of the tunable delay circuits 142, 144 of the first subset and of the tunable delay circuits 146, 148 of the second subset in opposite directions.

In an embodiment, the adjustable delayer 100 is optionally configured to tune the tunable delay circuits 142, 144 of the first subset and the tunable delay circuits 146, 148 of the second subset such that delays of the tunable delay circuits 142, 144 of the first subset and delays of the tunable delay circuits of the tunable delay circuits of the second subset change in the same direction (i.e., both increase or both decrease) with a variation of the first delay tuning information in the presence of a constant second delay tuning information. For example delays of the tunable delay circuits 142, 144 of the first subset increase with increasing values of the first delay tuning information 152, and delays of the tunable delay circuits 146, 148 of the second subset also increase with increasing values of the first delay tuning information 152 in the presence of a constant second delay tuning information 162. In this manner, it is possible to efficiently regulate the combined delay of the plurality of tunable delay circuits 142, 144, 146, 148 to fulfill a predetermined condition.

In an embodiment, the adjustable delayer 100 is optionally configured to tune the first subset of the tunable delay circuits and the second subset of the tunable delay circuits in such a manner that a magnitude of a change of a combined delay of the tunable delay circuits 142, 144 of the first subset caused by a given variation of the second delay tuning information 162 differs from a magnitude of a change of a combined delay of the tunable delay circuits 146, 148 of the second subset caused by the given variation of the second delay tuning information by no more than 60%. In this case, a sign of the change of the combined delay of the tunable delay circuits 142, 144 of the first subset is opposite to a sign of the change of the combined delay of the tunable delay circuits 146, 148 of the second subset.

In an embodiment, the closed-loop control circuit 150 is optionally configured to provide the first delay tuning information 152 to obtain a predetermined phase relationship between the input signal 110 and a delayed version of the input signal which is provided at an output of the series connection 140 of tunable delay circuits 142, 144, 146, 148. For example, the closed-loop control circuit 150 may be configured to provide the first delay tuning information 152 to obtain a predetermined phase relationship between the input signal 110 and an output signal of the tunable delay circuit 148.

In an embodiment, the adjustable delayer optionally comprises a delay locked loop. In this case, the delay locked loop comprises the closed-loop control circuit 150 and the series connection 140 of the plurality of tunable delay circuits 142, 144, 146, 148. In this case, the first delay tuning information 152 is the control quantity of the delay locked loop (wherein it should be noted, nevertheless, that the first delay tuning information is combined with the second delay tuning information 162 to obtain the combined delay tuning information 164). By using a delay locked loop, it is possible to efficiently regulate (i.e., tune) the combined delay of the plurality of tunable delay circuits 142, 144, 146, 148 to fulfill a predetermined condition.

In a preferred embodiment, the regulation loop (also designated as "closed loop" or "control loop" herein) comprises a time constant that is larger than a variation speed of the delay adjustment input. That means that the regulation loop is slow (or tardy) with respect to a signal change at the delay adjustment input (i.e., with respect to changes of the delay adjustment input information). For example, a maximum change of the delay per time unit caused by the regulation circuit may be smaller, for example, by a factor of 2 or even by a factor of 10, than a maximum change of the delay per time unit achievable by a change of the delay adjustment input information (wherein the delay adjustment input information may, for example, be provided in a time-discrete manner). Consequently, the regulation circuit does not immediately react to a detuning (or variation) of the delay, or at least does not immediately react in a significant manner.

In one embodiment, the second delay tuning information is a disturbance quantity of the delay locked loop. Accordingly, the adjustable delayer is configured to introduce into the delay locked loop a compensation, in order to at least partially compensate for the disturbance quantity. Thus, it is possible to avoid a significant distortion of the overall delay locked loop by the disturbance quantity, i.e., by the changes of the second delay tuning information.

In one embodiment, the closed-loop control circuit is (optionally) configured to receive the delay adjustment input information and to use the delay adjustment input information in order to at least partially compensate for the disturbance quantity. Thus, a significant distortion of the first delay tuning information, which is provided by the closed-loop control circuit, can be avoided. Also, a compensation of loop distortions caused by changes of the second delay tuning information can be achieved with comparatively small circuit effort by considering the delay adjustment input information, which described the second delay tuning information, in the closed-loop control circuit.

In one embodiment, the adjustable delayer may be configured to combine the delay adjustment input information with a phase detector reference signal or with a phase detector result signal or with an internal signal of a loop filter of the closed-loop control circuit, in order to at least partially compensate for the disturbance quantity.

To summarize the above, in some embodiments according to the invention a so-called two-point modulation is used. Regarding this concept, it should be noted that a regulation loop (also designated herein as closed loop or delay locked loop) normally reacts if a tuning information (or a tuning signal, which acts as a distortion) is introduced into the regulation loop an that the regulation loop tries to compensate for the distortion. It has been found that, in order to avoid this behavior of the compensation loop, it is advantageous to computationally eliminate or compensate the tuning information at an appropriate place of the loop.

However, in some embodiments according to the invention it is unnecessary to perform such a computational elimination of the tuning information. For example, there is only a small distortion of the regulation loop if both parts of the delay line 140 are driven in oppositely (i.e., delays of tunable delay circuits 142, 144 of the first subset and delays of tunable delay circuits 143,148 of the second subset are changed in opposite directions in response to a change of the second delay tuning information 162 or of the delay adjustment input information 120).

Nevertheless, in some other embodiments, the second delay tuning information 162 (which is based on the delay adjustment input information or derived therefrom), that is combined with the first delay tuning information 152 in the combiner 160, is fed into the closed loop control circuit. Alternatively, however, the delay adjustment input information is fed into the closed loop control circuit. In the closed loop control circuit, the delay adjustment input information (or, alternatively, the second delay tuning information) is combined with the phase detector signal (or phase detector result signal) or an internal signal of the loop filter (for example, low pass filter) such that the control loop remains locked and does not try to compensate for the delay adjustment input information by itself.

In an embodiment, the adjustable delayer optionally comprises a selector (not shown in FIG. 1). The selector is, in this case, configured to select a tap of the series connection 140 of tunable delay circuits 142, 144, 146, 148, and to provide the output signal 130 on the basis of a signal present at the selected tab, to coarsely adjust a delay between the input signal 110 and the output signal 130. In one embodiment, a tap or output of the tunable delay circuits 142, 144 of the first subset is selected by the selector, because the tunable delay circuits 142, 144 typically change their delays in the same direction in response to a variation of the second delay tuning information 162. Moreover, the adjustable delayer is configured to vary the second delay tuning information 162 based on the delay adjustment input information 120, to finely adjust the delay between the input signal 110 and the output signal 130. Accordingly, a good dynamic range of the delay adjustment can be achieved. Also, a good resolution can be achieved.

In an embodiment, the closed-loop control circuit 150 optionally comprises a phase detector configured to compare a phase of the input signal 110 with a phase of a delayed version of the input signal that is provided at an output of the series connection 140 of the tunable delay circuits (for example, at an output of the last tunable delay circuit 148). The phase detector is configured to provide a detector result signal. The closed-loop control circuit 150 comprises a low-pass filter configured to receive the phase detector result signal and to provide, on the basis thereof, the first delay tuning information 152. By using a phase detector and a low-pass filter, it is possible to achieve a good accuracy of the tuning of the combined delay of the series connection 140.

In an embodiment the adjustable delayer optionally comprises a first digital combiner (for example, the combiner 160) configured to add a value representing the second delay tuning information 162 to a value representing the first delay tuning information 152, to obtain a first digital-to-analog converter input information. In this case, the adjustable delayer also comprises a second digital combiner (not shown in FIG. 1) configured to subtract the value representing the second delay tuning information 162, or a positively scaled version thereof, from the value representing the first delay tuning information 152, to obtain a second digital-to-analog converter input information. Moreover, the adjustable delayer may also comprise a first digital-to-analog converter (not shown in FIG. 1) to provide a first analog control quantity (for example, the combined delay tuning information 164, that may be considered a combined delay tuning signal) for tuning a delay of a first subset of the tunable delay circuits (for example, the tunable delay circuits 142, 144) on the basis of the first digital-to-analog converter input information. Moreover, the adjustable delayer may comprise a second digital-to-analog converter configured to provide a second analog control quantity (for example, a second combined delay tuning information not shown in FIG. 1, that may be considered as a second combined delay tuning signal) for tuning a delay of the second subset of tunable delay circuits (for example, the tunable circuits 146, 148) on the basis of the second digital-to-analog converter input information. Accordingly, a simple yet precise signal processing can be achieved. For example, the closed-loop control circuit can operate precisely and provide a low noise digital representation of the first delay tuning information. Moreover, a digital addition (or, more generally, a digital combination) of the first delay tuning information 152 and of the second delay tuning information 162 can be performed, such that a low noise operation and a high precision can be achieved. Nevertheless, high delay tuning accuracy can be obtained by providing an analog control quantity to the tunable delay circuits.

It is also possible, however, in some embodiments that the first delay tuning information is a analog signal, i.e. the closed loop control circuit is an analog circuit or contains analog building blocks. In this case the first delay tuning information is combined with the second delay tuning information after the DAC.

In an embodiment, the tunable delay circuits 142, 144, 146, 148 are inverter stages or driver stages comprising a current limiter circuit. In this case, the current limiter circuit may be configured to adjustably limit an output current of the inverter stages or driver stages. In this manner, a propagation delay through the inverter stages or driver stages can be adjusted using a analog control quantity (e.g., the combined delay tuning signal) with a very high resolution.

In an embodiment, the adjustable delayer is optionally configured to derive the second delay tuning information 162 from one or more least significant bits of the delay adjustment input information 120. In this manner, a delay adjustment with a high resolution can be achieved. The possibility to adjust the propagation delays in the adjustable delay circuits with high accuracy is exploited.

In an embodiment, the adjustable delayer is optionally configured to derive a coarse delay adjustment information from one or more most significant bits of the delay adjustment input information 120. In this manner, both a fine delay adjustment and a coarse delay adjustment can be achieved, which provides for a good dynamic range of the delay adjustment.

In an embodiment, the adjustable delayer is optionally configured to temporarily break the closed loop, comprising the closed-loop control circuit 150, the series connection 140 of a plurality of tunable delay elements 142, 144, 146, 148 and the combiner 160. Moreover, the adjustable delayer 100 is configured to provide the output signal 130 using a first subset of the tunable delay circuits (for example, using the tunable delay circuits 142, 144) during a period of time in which the closed loop is broken, and to use the second subset of tunable delay circuits (for example, the tunable delay circuits 146, 148) for another functionality, other than providing the output signal, during the period of time in which the closed loop is broken. Moreover, the adjustable delayer is configured in one embodiment to re-establish a closed loop comprising the closed-loop control circuit 150, the series connection 140 of the plurality of tunable delay circuits 142, 144, 146, 148 and the combiner 160 after the temporary break of the closed loop, to thereby update the first delay tuning information 152. Accordingly, it is possible to perform other activities, like, for example, a calibration of the "gain" of the tunable delay circuits while, at the same time, providing the output signal 130 on the basis of the input signal. For example, the time during which the closed loop is broken may be shorter than a typical time span during which the environmental conditions like, for example, temperature and/or supply voltage, make a significant change. Accordingly, the temporary interruption of the closed loop does not have any significant detrimental effects, because the first delay tuning information 152 may, for example, be maintained in an unchanged manner during the period of time in which the closed loop is broken. Thus, the functionality of the tunable delay circuits 142, 144 of the first subset to provide the output signal 130 on the basis of the input signal 110 remains even during the period of time when the closed loop is broken. Nevertheless, breaking the loop allows to vary the delay of the tunable delay circuits 146, 148 of the second subset independent from the delay of the tunable delay circuits 142, 144 of the first subset without causing any counter-action by the closed-loop control circuit 150. Thus, it is possible to use the tunable delay circuits 146, 148 of the second subset for independent activities during the period of time in which the closed loop is broken. For example, the delay of the tunable delay circuits 146, 148 of the second subset may be adjusted independent from the first delay tuning information 152 and/or independent from the second delay tuning information 162 during the period of time in which the closed loop is broken, to thereby perform calibration activities or even any other activities.

In an embodiment, the adjustable delayer is optionally configured to periodically break the closed loop. Accordingly, it is possible to periodically perform "other activities" like, for example, calibration activities, using the tunable delay circuits 146, 148 of the second subset while still providing the output signal on the basis of the input signal.

In an embodiment, the adjustable delayer is optionally configured to determine or calibrate a gain of a delay adjustment of the tunable delay circuits (for example, of the tunable delay circuits 146, 148 of the second subset) during the period of time in which the closed loop is broken. Moreover, knowledge on the characteristics of the tunable delay circuits 146, 148 of the second subset may be used to conclude on characteristics of the tunable delay circuits 142, 144 of the first subset (because the tunable delay circuits 142, 144 may, for example, be structurally identical to the tunable delay circuits 146, 148), which, in turn, allows for a calibration of the delay adjustment. For example, such a procedure allows to set an appropriate gain factor for the derivation of the second delay tuning information or the combined delay tuning information from the delay adjustment input information 120.

In one embodiment, the adjustable delayer is configured to vary a delay of the tunable delay circuits 146, 148 of the second subset of tunable delay circuits and to monitor a change of a phase of a signal provided using the tunable delay circuits of the second subset of tunable delay circuits, to thereby obtain an information about the gain of the delay adjustment of the tunable delay circuits. In other words, a relationship between a change of the combined delay tuning information fed to the tunable delay circuits 146, 148 and a change of delay or a change of phase can be determined, and a calibration factor can be derived therefrom to achieve a well-defined relationship between a change of the delay adjustment input information 120 and a change of the delay between the input signal 110 and the output signal 130.

To summarize the above, the structure and functionality of the adjustable delayer 100 according to FIG. 1 has been discussed. Also, optional improvements have been discussed. However, it should be noted that the adjustable delayer 100 may actually be modified substantially.

In particular, more or less tunable delay circuits may be used. In a very simple embodiment, it may be sufficient to use a single tunable delay circuit. However, a larger number of tunable delay circuits may be used, wherein the tunable delay circuits may, optionally, be divided into (or, alternatively, comprise) a first subset of tunable delay circuits and a second subset of tunable delay circuits. Moreover, it should be noted that the calibration functionality as discussed before may be present in some embodiments according to the invention, while the calibration functionality may be omitted in other embodiments according to the invention. Furthermore, a percentage of time during which the closed-loop condition is present may vary in the embodiments according to the invention. In some embodiments, the closed-loop condition may be the temporally dominant mode of operation. In other embodiments, the closed-loop condition may only be established from time to time.

Moreover, different implementations are naturally possible. The concept as disclosed herein may be implemented in various different hardware technologies. Optionally, the concept disclosed herein may also be implemented in a programmable logic device, like, for example, a field programmable gate array, or the like. In some embodiments, a part of the functionality like, for example, the execution of some calculations or the combination of the first delay tuning information and the second delay tuning information, may be performed using a programmable computer hardware.

To summarize, many different implementations are possible, which all lie within the scope of the present invention.

Figure 2:
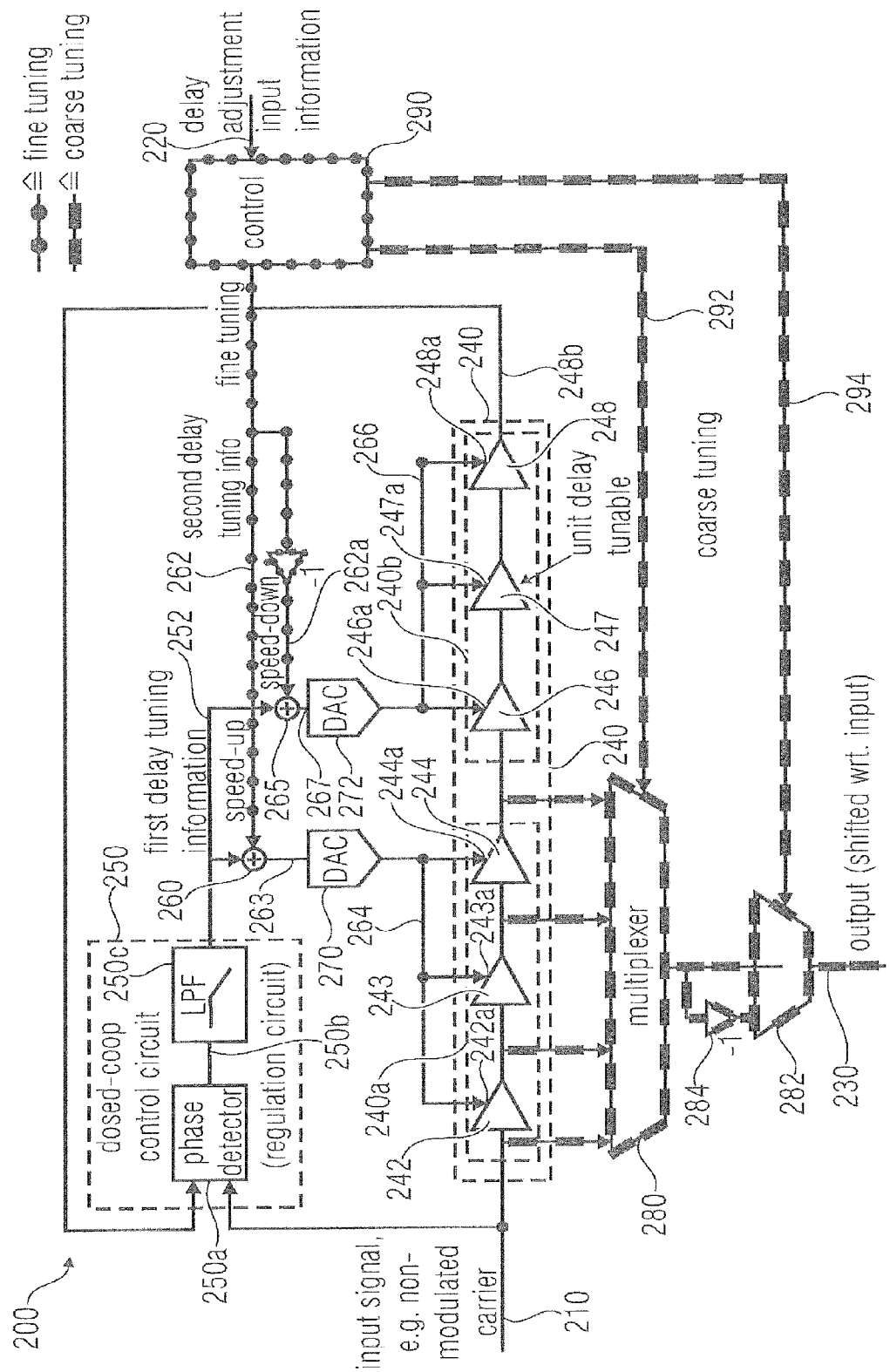
FIG. 2 shows a block schematic diagram of an adjustable delayer, according to another embodiment of the invention.

In the following, an adjustable delayer 200, a block schematic diagram of which is shown in FIG. 2, will be described in more detail. The adjustable delayer 200 is configured to receive an input signal 210, which may, for example, be a non-modulated carrier signal and which may be equivalent to the input signal 110. Moreover, the adjustable delayer 200 is configured to receive a delay adjustment input information 220, which describes a desired delay, and which may be equivalent to the delay adjustment input information 120. The adjustable delayer 200 is also configured to provide an output signal 230, which may, for example, be shifted (for example, with respect to time or with respect to phase) with respect to the input signal 210. The output signal 230 may be equivalent to the output signal 130.

The adjustable delayer 200 comprises a delay line 240, which, in turn, comprises a series connection of a first sub-delay line 240a and a second sub-delay line 240b. The input of the delay line 240 receives the input signal 210. An output of the first sub-delay line 240a is coupled with an input of the second sub-delay line 240b. The first sub-delay line 240 comprises a series connection of adjustable drivers 242, 243, 244 (also designated as adjustable delay drivers), that are connected in series between the input of the first sub-delay line 240a and the output of the first sub-delay line 240a. In other words, a signal input of the first adjustable driver 242 receives the input signal 210. A signal output of the first adjustable driver 242 is coupled to a signal input of the subsequent second adjustable driver 243. A signal output of the second adjustable driver 243 is coupled to a signal input of the third adjustable driver 244, and a signal output of the third adjustable driver 244 forms the output of the first sub-delay line 240a in this example. Similarly, the second sub-delay line 240b comprises a series connection of a plurality of adjustable drivers 246, 247, 248. A signal input of the fourth adjustable driver 246 constitutes an input of the second sub-delay line 240b and is coupled to a signal output of the third adjustable driver 244. A signal output of the fourth adjustable driver 246 is coupled to a signal input of the fifth adjustable driver 247. A signal output of the fifth adjustable driver 247 is coupled to a signal input of the sixth adjustable driver 248. A signal output of the sixth adjustable driver 248 forms the output of the second sub-delay line 240b in this example.

Delay adjustment inputs 242a, 243a, 244a of the adjustable drivers 242, 243, 244 are circuited in parallel to receive a first (combined) delay tuning signal 264. Similarly, delay adjustment inputs 246a, 247a, 248a are circuited to receive a second (combined) delay tuning signal 266.

It should be noted here that the first sub-delay line 240a may correspond to the first subset of tunable delay circuits discussed with respect to FIG. 1, and that the second sub-delay line 240b may correspond to the second subset of tunable delay circuits discussed with respect to FIG. 1. Moreover, it should be noted that the adjustable drivers (also designated as adjustable delay drivers) 242, 243, 244 may correspond to the tunable delay circuits 142, 144 discussed with respect to FIG. 1, and that the adjustable delay drivers 246, 247, 248 may correspond to the tunable delay circuits 146, 148 discussed with respect to FIG. 1. Moreover, it should be noted that the first (combined) delay tuning signal 264 may be a physical representation (e.g., in the form of an electrical signal) of the combined delay tuning information 164. The second (combined) delay tuning signal 266 may correspond to the combined delay tuning information, which is optionally fed into the tunable delay circuits 146, 148 as discussed above.

The adjustable delayer 200 also comprises a closed-loop control circuit or regulation circuit 250, that may be configured to receive the input signal 210 and an output signal 248b of the second sub-delay line 240b. However, the regulation circuit 250 may, in some embodiments, alternatively receive any intermediate signal of the first sub-delay line or of the second sub-delay-line, like, for example, a signal form a tap of the first sub-delay line, an output signal of the first sub-delay line or a signal from a tap of the second sub-delay line. The closed-loop control circuit or regulation circuit 250, which may be equivalent to the closed-loop control circuit or regulation circuit 150, may be configured to provide a first delay tuning information 252, which may be equivalent to the first delay tuning information 152.

The closed-loop control circuit 250 comprises a phase detector 250a, that receives the input signal 210 and the output signal 248b of the second sub-delay line 240b and provides, on the basis thereof, a phase detector result signal 250b, which may, for example, be a digital signal. The closed-loop control circuit 250 also comprises a low-pass filter 250c, that may, for example, be a digital low-pass filter, and that receives the phase detector result signal 250b. The low-pass filter 250c provides, as an output signal, the first delay tuning information 252, that may take the form of a digitally represented value (for example, a binary value). The adjustable delayer 200 also comprises a first combiner 260, that may, for example, be a digital adder. The first combiner 260 receives the first delay tuning information 252 and also receives a second delay tuning information 262, which may be a fine tuning information and which may take the form of a digitally represented value. The combiner 260 may be configured to sum the first delay tuning information 252 and the second delay tuning information 262 (which may take the form of a digital representation of a fine tuning value) and provides, on the basis thereof, a first combined digital value 263. The adjustable delayer 200 also comprises a first digital-to-analog converter 270, that is configured to provide the first (combined) delay tuning signal 264 on the basis of the first combined digital value 263.

The adjustable delayer 200 also comprises a second digital combiner 265, that receives the first delay tuning information 252 and an inverted version 262a of the second delay tuning information 262. The second digital combiner 265 sums the first delay tuning information 252 and the inverted version 262a of the second delay tuning information 262, to obtain a second combined digital value 267. Effectively, the second digital combiner 265 subtracts the value of the second delay tuning information 262 from the value of the first delay tuning information 252, while the first digital combiner 260 adds the value of the second delay tuning information 262 to the value of the first delay tuning information 252.

The adjustable delayer 200 also comprises a second digital-to-analog converter 270, that provides the second (combined) delay tuning signal 266 on the basis of the second combined digital value 267.

In some embodiments, the first and second digital-to-analog converter may be implemented as a differential DAC receiving both a common mode vcm and a differential mode vdm control input. The differential DAC then generates two outputs. A first output is defined by vcm+vdm/2 and a second output is defined by vcm−vdm/2. In this case there is a single but more complex DAC instead of two DACs.

To summarize, the adjustable delayer 200 comprises a delay locked loop, that in turn comprises an adjustable delay line 240, the closed-loop control circuit 250, the combiners 260, 265 and the digital-to-analog converters 270, 272. The delay locked loop effectively provides the first delay tuning information 252 such that a predetermined phase relationship between the input signal 210 and the output signal 248b of the delay line 240 is achieved (at least within a predetermined tolerance).

The combiners 260, 265 overlay a value determined by the second delay tuning information 262 to the value of the first delay tuning information 252, wherein the value of the second delay tuning information 262 is added to the value of the first delay tuning information 263 to obtain the first (combined) delay tuning signal 264, and wherein the value of the second delay tuning information 262 is effectively subtracted from the value of the first delay tuning information 252 to obtain the second (combined) delay tuning signal 266.

However, at least in a closed-loop condition, the closed-loop control circuit 250 provides the first delay tuning information 252 to keep the phase relationship between the input signal 210 and the output signal 248b of the delay line 240 at least approximately constant, even in the case of distortions caused by the variations of the second delay tuning information 262. Moreover, it should be noted that distortions of the phase difference between the input signal 210 and the output signal 248b caused by variations of the second delay tuning information 262 are typically relatively small, because, for example, an increase of the second delay tuning information 262 causes an increase of a combined delay of the first sub-delay line 240a and a reduction of a combined delay of the second sub-delay line 240b, wherein the circuitries are, in one embodiment, preferably dimensioned in such a manner that the delay variation of the first sub-delay line 240a caused by a variation of the second delay tuning information 262 is at least approximately compensated by an opposite delay variation of the second sub-delay line 240b.

Moreover, the adjustable delayer 200 comprises a first multiplexer 280, a first signal input of which is coupled to the signal input of the first adjustable delay driver 242, a second signal input of which is coupled to the signal output of the first adjustable delay driver 242, a third signal input of which is coupled to the signal output of the second adjustable delay driver 243 and a fourth signal input of which is coupled to the signal output of the third adjustable driver 244. A signal output of the first multiplexer 280 is coupled to a first signal input of a second multiplexer 282. Moreover, an inverter 284 is coupled between the signal output of the first multiplexer 280 and a second signal input of the second multiplexer 282, such that the second multiplexer 282 receives the output signal of the first multiplexer 280 and an inverted version thereof.

The adjustable delayer 200 also comprises a control or control circuit 290, that is configured to receive the delay adjustment input information 220 and provide, on the basis thereof, the fine tuning information, i.e. the second delay tuning information 262, and a coarse tuning information like, for example, a control information 292 for the first multiplexer 280 and a control information 294 for the second multiplexer 282. Additionally the control circuit 290 may invert the input signal in response to the delay adjustment input information. In this manner, a coarse delay setting can be performed using the multiplexers 280, 282, wherein the first multiplexer 280 may be used to adjust the delay between the input signal 210 and the output signal 230 in steps that are equal to the delay of one of the adjustable delay drivers 242, 243, 244. In addition, an inversion of the signal may be performed using the multiplexer 282, that may be considered as a delaying by approximately half a period of the input signal 210 for periodic input signals (at least under the assumption of a 50% duty cycle). In contrast, a significantly finer delay adjustment can be achieved using the second delay tuning information 262, wherein a resolution is typically smaller than, for example, 10% of a delay of an adjustable delay buffer 242, 243, 244.

Figure 6:
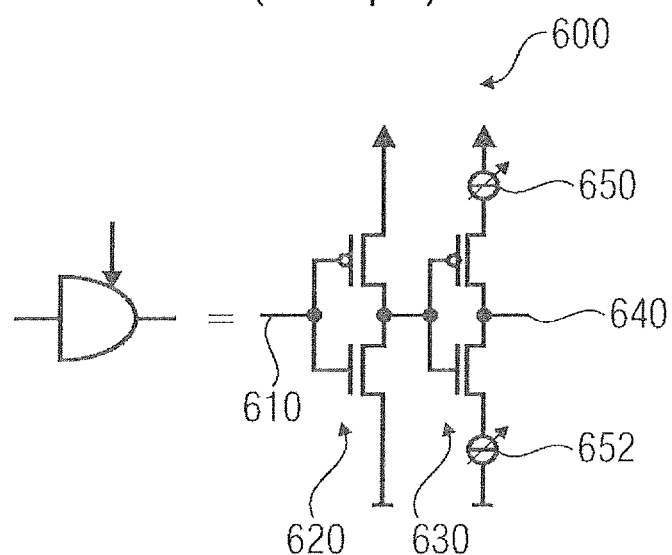
FIG. 6 shows a schematic of an adjustable delay driver, which can be used in embodiments of the invention.

To facilitate the understanding, an example of an adjustable delay driver will be briefly described taking reference to FIG. 6. FIG. 6 shows a schematic of such an adjustable delay driver, which may take the place of the adjustable delay drivers 242, 243, 244, 246, 247, 248 in one embodiment. As can be seen, the adjustable delay driver 600 according to FIG. 6 comprises a signal input 610, a first inverter circuit 620, a second inverter circuit 630 and a signal output 640. Moreover, a current that can be provided at the signal output 640 by the second inverter circuit 630 is adjustable using current sources 650, 652, wherein the current sources 650, 652 may be adjusted based on the respective (combined) delay tuning signal (for example, the first (combined) delay tuning signal 264 or the second (combined) delay tuning signal 266) that is fed to the delay tuning input (for example, the delay tuning input 242a, 243a, 244a) of the adjustable delay driver.

In the following, the concept that has been described above with reference to FIG. 2 will be briefly summarized, and some additional features will also be described. Moreover, some application scenarios will be outlined.

It should be noted here that the adjustable delayer 200 according to FIG. 2 can be used in an approach for phase modification in which a PLL (phase locked loop) (containing, for example, a coarse digital controlled oscillator) generates a fixed, i.e. not modulated, carrier signal. The PLL may be analog or digital. A signal may be fed to a tunable delay element (or tunable delayer) that shifts the phase according to the modulating signal (wherein the modulating signal may, for example, constitute a delay adjustment input information). A digitally tunable delay element (or digital delayer) is also known as digital-to-time converter (DTC). A technical challenge with this concept is that modern communication standards require a very high DTC resolution (which may, in some applications, be approximately 0.1 ps). Such an accuracy may be reached by embodiments according to the invention. However, it should be noted that in other embodiments, the requirements regarding the resolution may actually also be more relaxed or even more stringent.

Embodiments according to the invention can provide a high resolution in a digital-to-time conversion. According to the embodiment of FIG. 2, the high resolution digital-to-time conversion is done in two steps.

A coarse phase shifting is done by delaying the input signal 210 (which may be considered as signal to be delayed) in a delay chain 240. An appropriate tap of the delay chain is selected by a multiplexer 280 according to most significant bits of a control word (for example, according to most significant bits of the delay adjustment input information 220, which may, for example, represent a modulation in a phase modulator or polar transmitter). This enables, for example, a resolution of 4-10 ps in a technology node smaller than 65 nm (depending on the delay cell concept). However, different resolutions are naturally possible depending on the used technology and the circuit concept.

For fine tuning, the delay elements 242, 243, 244, 246, 247, 248 in the delay chain 240 are tuned according to the least significant bits of the control word (for example, of the delay adjustment input information 220). Tuning of the delay elements is based on analog effects. Regarding this issue, it should be understood that the delay of the delay elements 242, 243, 244, 246, 247, 248 varies strongly with process, voltage and temperature (PVT). To use a delay line 240, 240a, 240b (or a single delay element 242, 243, 244, 246, 247, 248) as a phase shifter, however, the absolute delay of the delay line or of the delay element 242, 243, 244, 246, 247, 248 should be known (at least with respect to some reference) and adjusted (e.g., to compensate for temperature changes, voltage changes and/or process variations).

It has been found that it is generally advantageous to tune the delay of the delay elements independent of using this tuning for fine resolution or not. It has also been found that it is advantageous to embed the delay line into a delay locked loop to compensate for PVT variations. This is a control loop that tunes the overall delay along the chain 240 (for example, the delay between the input of the delay line 240, which receives the input signal 210, and the output of the delay line 240, which provides the output signal 248b) so that it corresponds exactly (or at least approximately within an acceptable tolerance) to one period or any other integer number of periods of the clock signal 210 to be shifted (wherein it is assumed that the input signal 210 is a "clock signal" or quasi periodic signal). For example, the input signal may be approximately periodic, for example, with some initial phase modulation. If the delay locked loop (DLL) has locked and if the delay line consists of N elements, the coarse phase resolution is $2 \times \pi / N$ (because the delay locked loop regulates the delay between the input signal 210 and the output signal 248b of the delay line 240 to be equal to a period time (or an integer multiple of a period time) of the (preferably, but not necessarily, periodic) input signal 210).

The parts in FIG. 2 drawn using solid lines (rather than dotted lines or hashed lines) indicate a digital delay locked loop. The phase detector 250a measures a phase difference between the incoming signal (input signal 210) and the delayed signal (signal 248b). The phase detector can be implemented as a basic early-late detector or as a full-blown time-to-digital converter or as any compromise in between these two solutions. The additional low pass filter 250c eliminates high frequency components and generates the control signal (for example, the first delay tuning information 252) for the delay elements. This control signal (for example, the first delay tuning information 252) is applied to the delay elements 242, 243, 244, 246, 247, 248 via a digital-to-analog converter (for example, the digital-to-analog converter 270 and also the digital-to-analog converter 272). The delay elements 242, 243, 244, 246, 247, 248 may, for example, be current starved inverters, wherein the series device is used for delay tuning. Naturally, the delay elements may also be current starved drivers or "adjustable delay drivers". It should also be noted that an example of such an adjustable delay driver has been briefly discussed with reference to FIG. 6, wherein the adjustable current sources 650, 652 may be considered as "series devices".

According to the embodiments shown in FIG. 2, additional input is added to the digital-to-analog converters (which is shown by dotted lines) controlled by the least significant bits (LSBs) of the phase control signal (for example, of the delay adjustment input information 220). This means that the delay (for example, the delay of the first sub-delay line 240a and/or the delay of the second sub-delay line 240b) is not only determined by the control loop (delay locked loop) but also by the least significant bits of the input signal (i.e., the phase control signal or delay adjustment input information 220).

It has been found that the delay locked loop (DLL) would try to compensate for the additional delay tuning (caused, for example, by the delay adjustment input information 220) if the additional delay tuning results in a change of the combined delay between the input signal 210 and the output signal 248b of the delay line 240. Also, it has been found that the additional delay tuning may even push the delay locked loop out of lock if the additional delay tuning (caused, for example, by the delay adjustment input information 220) results in a change of the combined delay between the input signal 210 and the output signal 248b of the delay line 240.

According to the embodiment shown in FIG. 2, the delay line 240 is thus partitioned into two parts 240a, 240b. The delay along the first part 240a is increased by the input signal (for example, by the second delay tuning information 262, that is based on the delay adjustment input information 220), while the delay along the second part 240b is decreased by the input signal (for example, by the second delay tuning information 262, that is based on the delay adjustment input information 220) (or vice versa). Therewith, the overall delay along the delay line 240 (i.e., the delay between the input signal 210 and the output signal 248b of the delay line 240) remains "in locked condition" (e.g., at least approximately constant) and the delay locked loop typically remains locked (even for a change of the second delay tuning information 262 over a full variation range). Consequently, the additional delay tuning (which is caused, for example, by the second delay tuning information 262, or, more precisely, by the combination of the second delay tuning information 262 with the first delay tuning information 252) is transparent for the control loop.

For coarse delay tuning, taps in the first sub-delay line 240a are fed to the multiplexer 280 and can be inverted (that results in a phase shift of approximately 180°, that is equivalent to a delay of half a period time of a periodic input signal 210).

In one embodiment, the delay line 240 is (optionally) implemented differentially, so the inversion does not cause phase error (or hardly any phase error). Of course, the other taps (for example, the taps of the second sub-delay line 240b) may be used as well.

However, using only the first part 240a of the delay elements 242, 243, 244, 246, 247, 248 (for example, for the provision of the output signal 230 of the adjustable delayer 200) leaves the second part 240b free for other activities.

Such an activity may be the characterization of the delay elements (for example, of the adjustable delay drivers 242, 243, 244, 246, 247, 248) to calibrate the gain of the side input (background calibration). Therefore, the control loop of the delay locked loop is broken (for example, by decoupling or disconnecting the (combined) delay tuning signals 266 from the closed-loop control circuit) for short periods and the delay of the second part 240b is disturbed (for example, by varying the input signals of the second digital-to-analog converter in a predetermined manner) for characterization of the delays. The operation (for example, the provision of the output signal 230 on the basis of the input signal 210) is not interrupted as the first sub-delay line 240a is not disturbed (for example, the last value provided by the closed-loop control circuit 250 before the breaking of the closed loop is combined with the second delay tuning information 262 even when the closed loop is broken) and variation of voltage and temperature has no (or no significant) effect, as the loop is broken only for a very short time (for example, for a period of time during which temperature and supply voltage are approximately constant).

In other words, when the loop is open (i.e. the closed loop is broken), the delays of the adjustable delay drivers 246, 247, 248 may be varied independently from the delays of the adjustable delay drivers 242, 243, 244. A ratio between the change of the second digital-to-analog converter input signal 267, that may be varied independent from the first delay tuning information 252 and/or independent from the second delay tuning information 262 in the open-loop mode, and the phase variation of the output signal 248b may be used to determine the "gain" of the delay variation. Knowledge of the "gain" of the delay variation may be used to determine or adjust a scaling factor, for example for the derivation of the second delay tuning information 262 from the delay adjustment input information 220, to have a well defined ratio between, on the one hand, a change of the delay adjustment input information 220 and, on the other hand, a change of the delay between the input signal 210 and the output signal 230.

Figure 3:
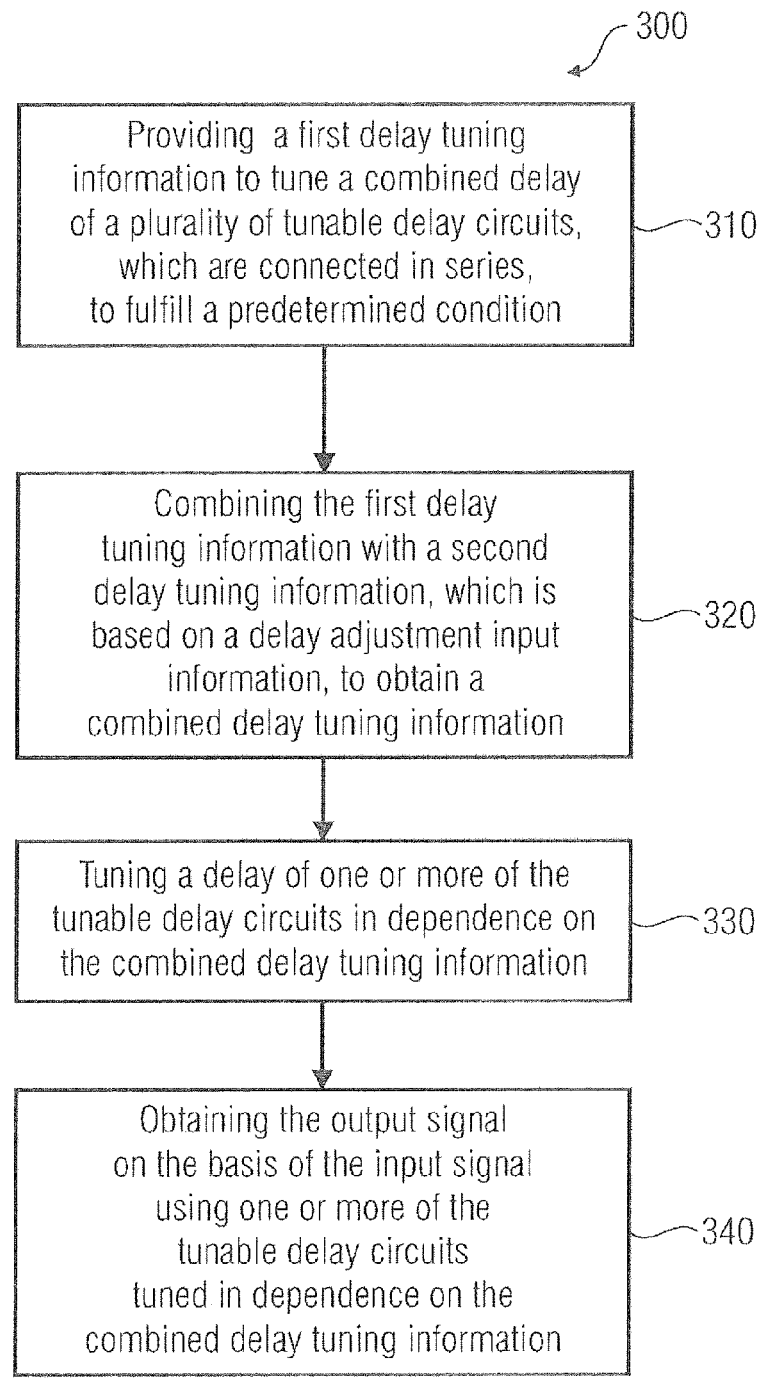
FIG. 3 shows a flowchart of a method for delaying an input signal based on a delay adjustment input information, according to an embodiment of the invention.

In the following, a method 300 for delaying an input signal based on a delay adjustment input information describing a desired delay will be described taking reference to FIG. 3.

The method 300 comprises a step of providing 310 a first delay tuning information to tune a combined delay of a plurality of tunable delay circuits, that are connected in series, to fulfill a predetermined condition. The method 300 also comprises a step 320 of combining the first delay tuning information with a second delay tuning information, that is based on a delay adjustment input information describing a desired delay, to obtain a combined delay tuning information. The method 300 also comprises a step 330 of tuning a delay of one or more of the tunable delay circuits based on the combined delay tuning information. The method 300 also comprises a step 340 of obtaining the output signal on the basis of the input signal using one or more of the tunable delay circuits tuned based on the combined delay tuning information.

Regarding the functionality of the method, it should be noted that the method in one embodiment implements the functionality of the adjustable delayer 100 according to FIG. 1 and of the adjustable delayer 200 according to FIG. 2. Moreover, it should be noted that the method 300 can be supplemented by any of the features or functionalities disclosed herewith with respect to the apparatuses.

Figure 4:
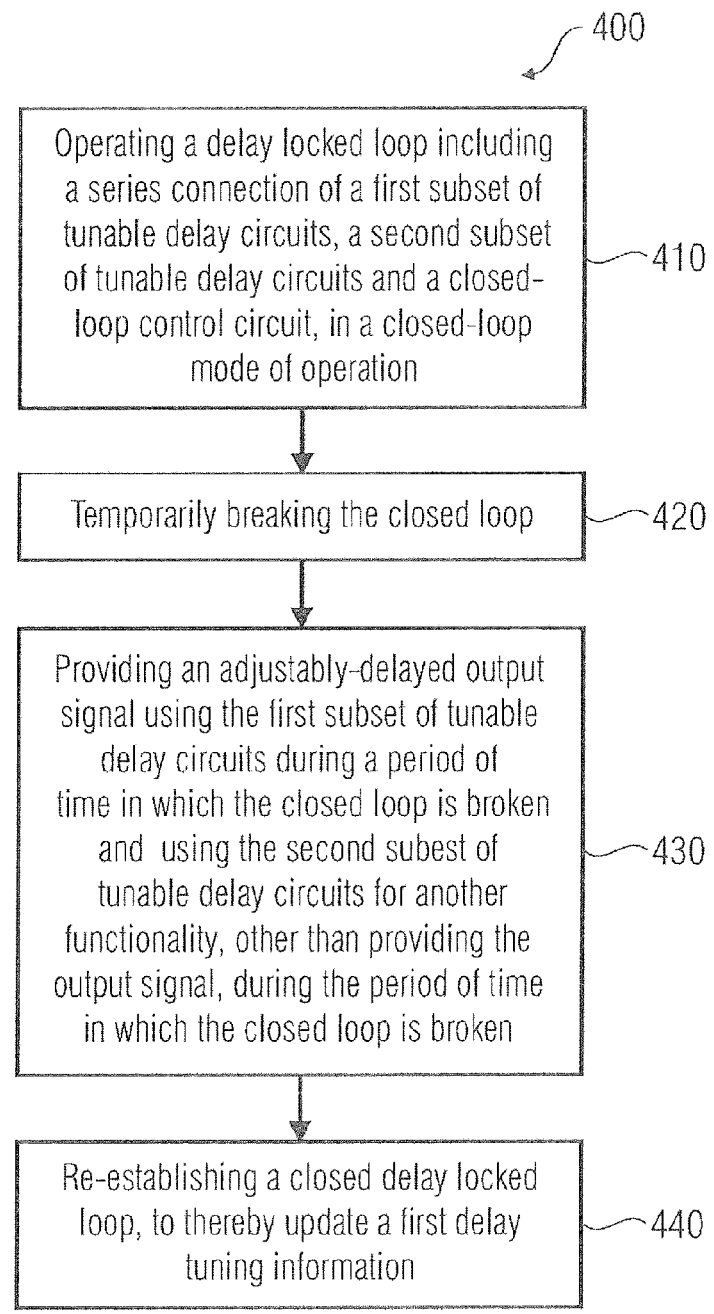
FIG. 4 shows a flowchart of a method for operating an adjustable delayer, according to an embodiment of the invention.

In the following, a method 400, a flowchart of which is shown in FIG. 4, will be described. The method 400 comprises a step 410 of operating a delay locked loop including a series connection of a first subset of tunable delay circuits, a second subset of tunable delay circuits and a closed-loop control circuit in a closed-loop mode of operation. The step 410 may, for example, comprise the functionality of the method steps 310, 320, 330, 340 of the method 300. The method 300 also comprises a step 420 of temporarily breaking the closed loop. Also, the method 400 comprises a step 430 of providing an adjustably-delayed output signal using the first subset of tunable delay circuits during a period of time in which the closed loop is broken and using the second subset of tunable delay circuits for another functionality, other than providing the output signal (and, in one embodiment, also other than regulating a combined delay of the tunable delay circuits), during the period of time in which the closed loop is broken. Moreover, the method 400 also comprises a step 440 of re-establishing a closed delay locked loop, to thereby update a first delay tuning information.

It should be noted that the method 400 may be implemented in the adjustable delayer 100 according to FIG. 1 and in the adjustable delayer 200 according to FIG. 2. Moreover, the method 400 may be supplemented by any of the features and functionalities disclosed herein with respect to the apparatuses.

Figure 5:
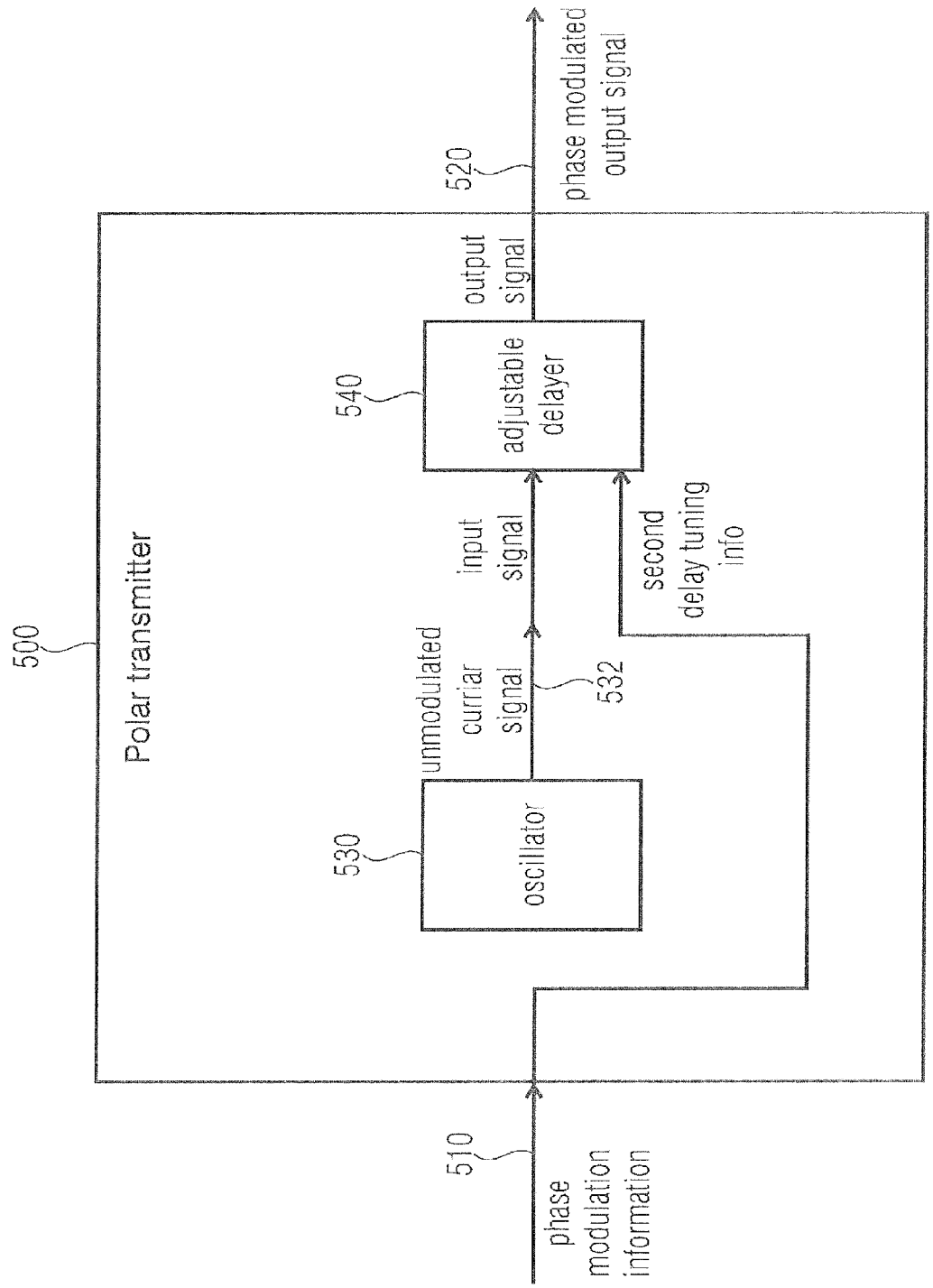
FIG. 5 shows a block schematic diagram of a polar transmitter, according to an embodiment of the invention.

In the following, a polar transmitter according to an embodiment of the invention will be described taking reference to FIG. 5, which shows a block schematic diagram of such a polar transmitter 500.

The polar transmitter 500 is configured to receive a phase modulation information and provide a phase modulated output signal 520 based on the phase modulation information 510. The polar transmitter comprises an oscillator 530 that is configured to provide an unmodulated carrier signal 532. The polar transmitter also comprises an adjustable delayer 540, that may, for example, be identical to the adjustable delayer 100 according to FIG. 1 or the adjustable delayer 200 according to FIG. 2. The adjustable delayer 540 is configured to receive the unmodulated carrier signal 532 as the input signal and also receive the phase modulation information 510 as the second delay tuning information. Alternatively, the adjustable delayer 540 may be configured to derive the second delay tuning information from the phase modulation information, for example, using the control 290. For example, the second delay tuning information may be derived from the least significant bits of the phase modulation information 510. Moreover, it should be noted that the output signal of the adjustable delayer 540 is the phase modulator output signal 520. Naturally, some post processing may be performed to drive the phase modulated output signal 520 from the output signal.

Figure 7:
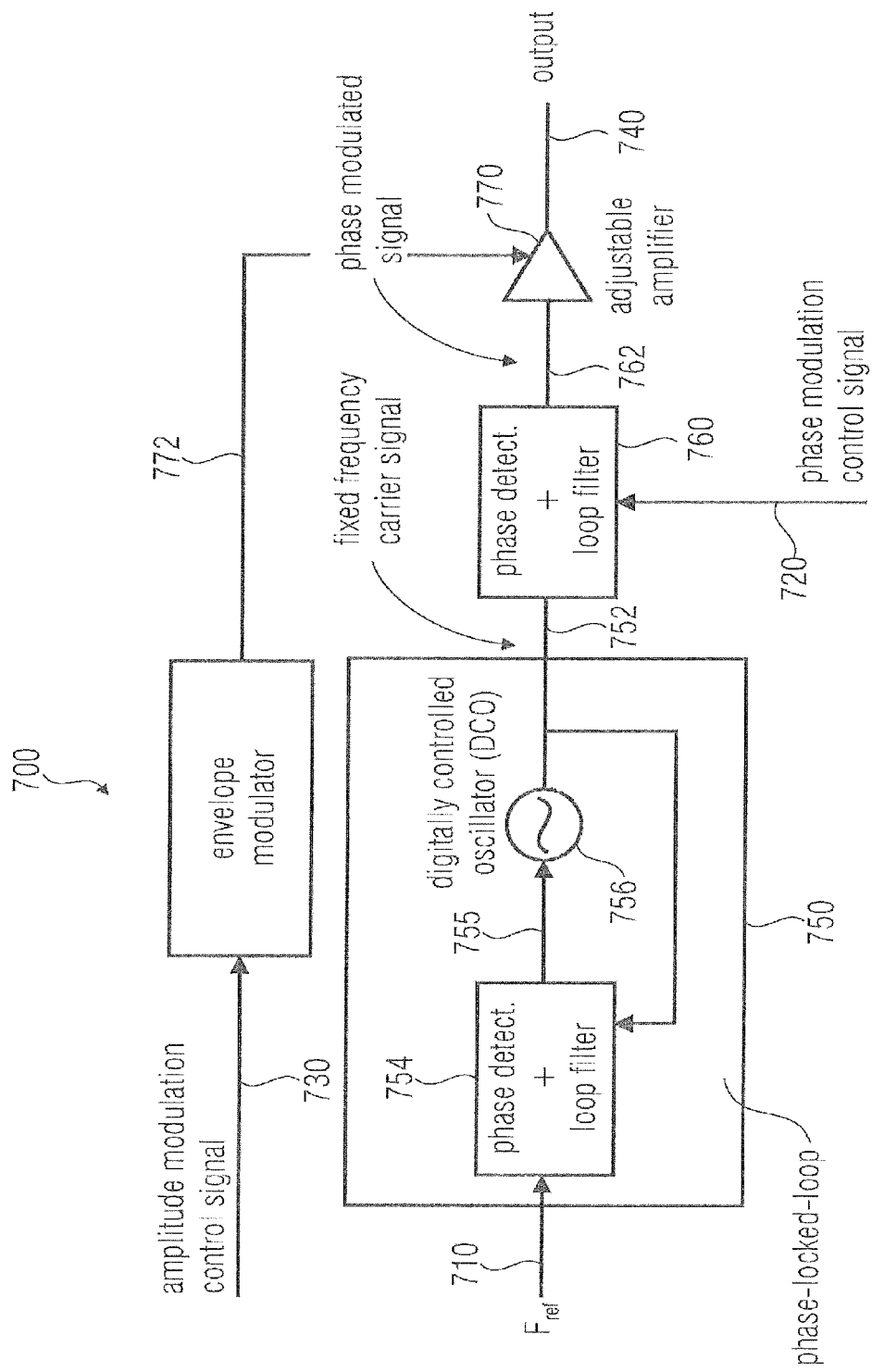
FIG. 7 shows a block schematic diagram of a polar transmitter, according to another embodiment of the invention.

FIG. 7 shows a block schematic diagram of a polar transmitter 700, according to another embodiment of the invention. The polar transmitter 700 is configured to receive (or generate by itself) a reference frequency 710 (Fref), a phase modulation control signal 720 (that may be equivalent to the phase modulation information 510) and an amplitude modulation control signal 730. Also the polar transmitter 700 is configured to provide a modulated output signal 740. The polar transmitter comprises a phase locked loop 750 that receives the reference frequency signal 710 and provides, on the basis thereof, a fixed frequency carrier signal 752. The phase locked loop 750 comprises phase detector and loop filter 754 and a digitally controlled oscillator (or other variable frequency oscillator) 756. The phase detector and loop filter 754 receives the reference frequency signal 710 and the output signal 752 of the oscillator 756, performs a phase comparison and provides, on the basis of the phase comparison, a control signal 755 (that is, in one embodiment, a frequency control signal) for the oscillator 756.

The polar transmitter 700 also comprises an adjustable delayer 760, that receives, as an input signal, the fixed-frequency carrier signal 752 and also receives the phase modulation control signal 720 as a phase adjustment input information. The adjustable delayer 760 provides, as its output signal, a phase modulated signal 762. The adjustable delayer 760 may be identical or similar to the adjustable delayers 100, 200 described herein.

The polar transmitter also comprises an adjustable amplifier 770, that receives the phase modulated signal 762 and a gain adjustment signal 772 and provides, on the basis thereof, the output signal 740, wherein a gain for the provision of the output signal 740 on the basis of the phase modulated signal 762 is determined by the gain adjustment signal 772.

Moreover, the polar transmitter 700 comprises an envelope modulator 780, that receives the amplitude modulation control signal 730 and provides, on the basis thereof, the gain adjustment signal 772.

To summarize, the polar transmitter 700 provides a fixed frequency carrier signal 752 (the frequency of which may naturally be adapted time to time to an active channel) using the phase locked loop 750, adds an adjustable phase shift to the fixed frequency carrier signal using the adjustable delayer 760 based on the phase modulation control signal 720, to obtain the phase modulated signal 762, and modulates the amplitude of the phase modulated signal 762 based on the amplitude modulation control signal 730 using the adjustable amplifier 770, to obtain the output signal 740.

Figure 8:
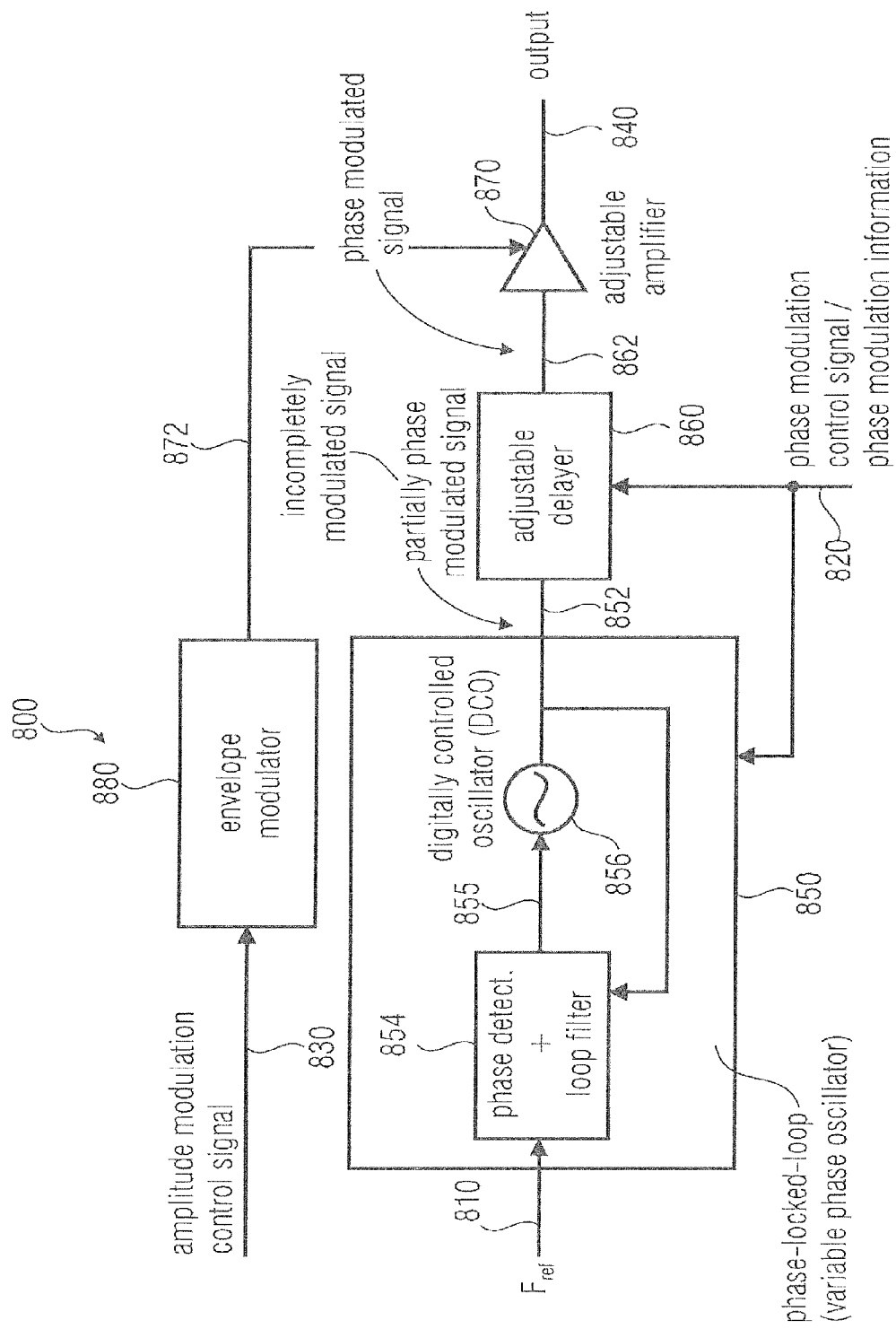
FIG. 8 shows a block schematic diagram of a polar transmitter, according to another embodiment of the invention.

FIG. 8 shows a block schematic diagram of a polar transmitter, according to another embodiment of the invention.

The polar transmitter 800 is configured to receive (or generate by itself) a reference frequency 810 (Fref), a phase modulation control signal 820 (that may be equivalent to the phase modulation information 510) and an amplitude modulation control signal 830. Also the polar transmitter 800 is configured to provide a modulated output signal 840. The polar transmitter 800 comprises a phase locked loop 850 that receives the reference frequency signal 810 and the phase modulation control signal 820 (or at least a component thereof, like, for example, a most-significant component or a least significant component) and provides, on the basis thereof, a partially phase modulated signal 852 which may also be considered as an incompletely modulated signal. The phase locked loop 850 may act as a variable phase oscillator. The phase locked loop 850 comprises a phase detector and loop filter 854 and a digitally controlled oscillator (or other variable frequency oscillator) 856. The phase detector and loop filter 854 receives the reference frequency signal 810 and the output signal 852 of the oscillator 856, performs a phase comparison and provides, on the basis of the phase comparison, a control signal 855 (that is, in one embodiment, a frequency control signal) for the oscillator 856. A phase modulation of the signal 852 is achieved based on the phase modulation control signal 820 (or at least a component thereof, like, for example, a most-significant component or a least significant component).

The polar transmitter also comprises an adjustable delayer 860, that receives, as an input signal, the partially phase modulated signal 852 and that also receives the phase modulation control signal 820 (or at least a component thereof, like, for example, a most-significant component or a least significant component) as a phase adjustment input information. The adjustable delayer 860 provides, as its output signal, a phase modulated signal 862. The adjustable delayer 860 may be identical or similar to the adjustable delayers 100, 200 described herein.

The polar transmitter also comprises an adjustable amplifier 870, that receives the phase modulated signal 862 and a gain adjustment signal 872 and provides, on the basis thereof, the output signal 840, wherein a gain for the provision of the output signal 840 on the basis of the phase modulated signal 862 is determined by the gain adjustment signal 872.

Moreover, the polar transmitter 800 comprises an envelope modulator 880, that receives the amplitude modulation control signal 830 and provides, on the basis thereof, the gain adjustment signal 872.

To summarize, the polar transmitter 800 provides a partially phase modulated signal 852 (the frequency of which may naturally be adapted from time to time to an active channel) based on the phase modulation control signal 820 using the phase locked loop 850, adds another adjustable phase shift to the partially phase modulated signal 852 using the adjustable delayer 860 based on the phase modulation control signal 820, to obtain the phase modulated signal 862, and modulates the amplitude of the phase modulated signal 862 based on the amplitude modulation control signal 830 using the adjustable amplifier 870, to obtain the output signal 840.

Figure 9:
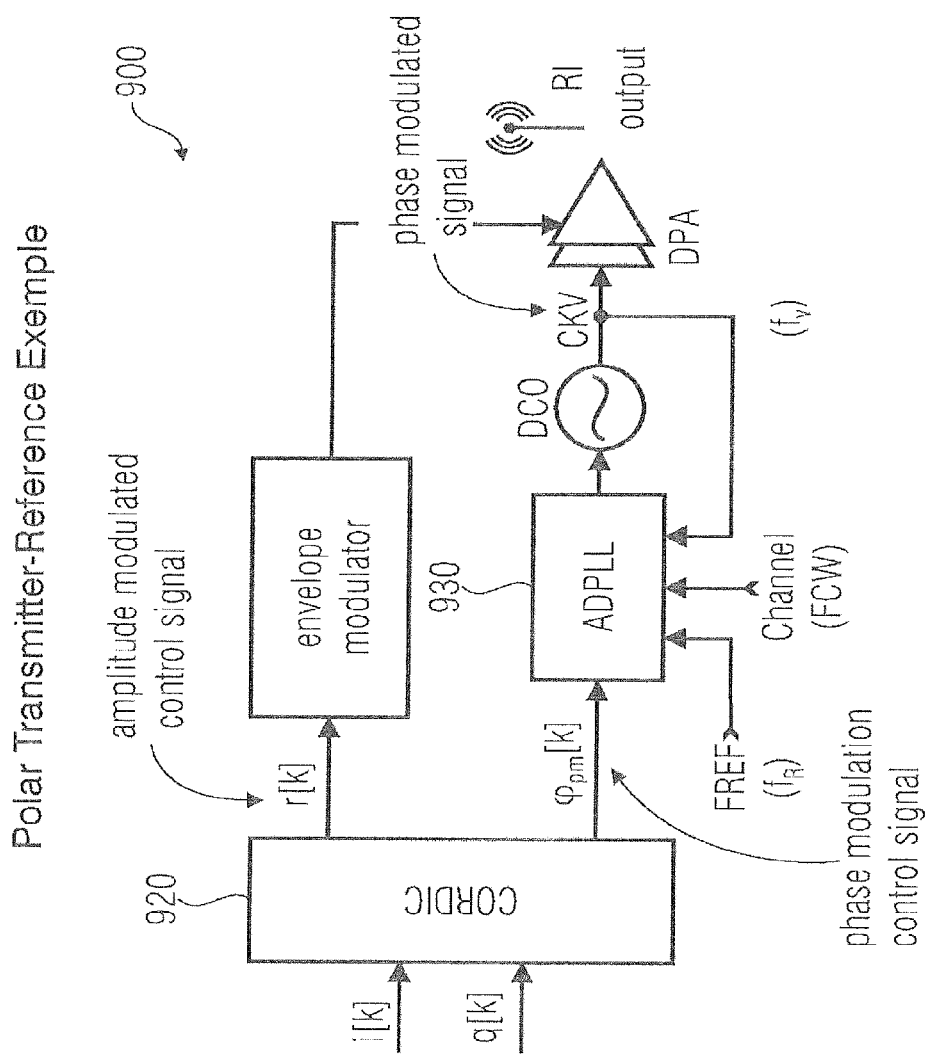
FIG. 9 shows a block schematic diagram of a polar transmitter, according to a reference example.

FIG. 9 shows a block schematic diagram of a polar transmitter, according to a reference example.

As can be seen, a CORDIC coordinate transformer 920 receives an inphase component i[k] and a quadrature component q[k], that may be time discrete values. The CORDIC coordinate transformer 920 provides, on the basis thereof, an amplitude modulation control signal r[k] and a phase modulation control signal $\phi_{pm}[k]$. It should be noted that the CORDIC coordinate transformer may also be used to provide the amplitude modulation control signal 730,830 and the phase modulation control signal 720,820 of FIGS. 7 and 8 respectively.

Moreover, the polar transmitter 900 also comprises an ADPLL, that is part of a phase regulation loop, and that receives the phase modulation control signal, a reference frequency signal FREF, a channel selection Information "Channel" and an output signal of a digitally controlled oscillator 930. It should be noted that the ADPLL 930 may, for example, be applied in the phase-locked-loop 850 (for example, to replace the phase detector and loop filter 854).

Furthermore, it should be noted that the structure of the output portion of the polar transmitter 900 is similar to the structure of the output portion of the polar transmitters 700, 800, such that a repeated description is omitted here for the sake of brevity. Rather, reference is made to the above discussion.

To summarize the above, embodiments according to the invention create a delay line embedded in a delay locked loop that comprises two sub-delay lines. The circuit in one embodiment comprises a digital control input that increases (decreases) the delay along the first sub-delay line and decreases (increases) the delay along the second sub-delay line simultaneously such that the overall delay remains constant. The circuit also comprises a multiplexer to connect the output of one delay element of the first sub-delay line to the output of the device.

In an optional improvement, the circuit comprises a control circuit that breaks the control loop periodically for short periods. After breaking the loop the delay along the second delay line is increased/decreased until the phases are equal again. By doing this the gain of the side input is measured and can be used for modulation of the phase in the first delay line accurately.

Moreover, it should be noted that in one embodiment, the adjustable delayer block may be located within a radio frequency macro (RF macro). The block, that forms the adjustable delayer, may comprise a large, well-organized layout and may have a very regular structure itself. However, different implementations are naturally possible.

To further conclude, some embodiments according to the invention create a highly accurate phase shifter that may be used as a phase modulator in polar transmitters. It generates an output signal that is a phase shifted, i.e. delayed, version of an input signal.

Some embodiments according to the invention outperform alternative phase modulation concepts where phase modulation is done by modulating the instantaneous frequency of a digital control oscillator (DCO). Accordingly, some embodiments according to the invention allow fulfilling high noise and frequency requirements.

In an alternative implementation of a polar transmitter the phase modulation is done by both, modulating the oscillator output (the oscillator is normally part of a phase locked loop) and by additionally delaying/modulating this oscillator output signal with an adjustable delayer circuit in order to provide the modulated output signal. Thus the phase modulation information affects both the phase locked loop containing the oscillator and the adjustable delayer. In a special implementation the oscillator does the fine tuning and the adjustable delayer the coarse tuning. Alternatively the oscillator does the coarse phase modulation and the adjustable delayer the fine tuning/modulation.

What is claimed is:

1. An adjustable delayer for adjustably delaying an input signal based on a delay adjustment input information describing a desired delay, to obtain an output signal, the adjustable delayer comprising:
   a plurality of series-connected tunable delay circuits, wherein a first of the tunable delay circuits is configured to receive the input signal;
   a closed-loop control circuit configured to provide a first delay tuning information to tune a combined delay of the plurality of tunable delay circuits to fulfill a predetermined condition; and
   a combiner configured to combine the first delay tuning information with a second delay tuning information, that is based on the delay adjustment input information, to obtain a combined delay tuning information;
   wherein the adjustable delayer is configured to tune a delay of one or more of the tunable delay circuits based on the combined delay tuning information; and
   wherein the adjustable delayer is configured to provide the output signal based on one or more signals present at one or more outputs of one or more of the tunable delay circuits.

2. The adjustable delayer according to claim 1, wherein the adjustable delayer is configured to tune a first subset of the tunable delay circuits and a second subset of the tunable delay circuits such that delays of the tunable delay circuits of the first subset increase with increasing values of the second delay tuning information and such that delays of the tunable delay circuits of the second subset of the tunable delay circuits reduce with increasing values of the second delay tuning information in the presence of a constant first delay tuning information.

3. The adjustable delayer according to claim 2, wherein the adjustable delayer is configured to tune the first subset of the tunable delay circuits and the second subset of the tunable circuits such that delays of the tunable delay circuits of the first subset and delays of the tunable delay circuits of the second subset change in the same direction with a variation of the first delay tuning information in the presence of a constant second delay tuning information.

4. The adjustable delayer according to claim 2, wherein the adjustable delayer is configured to tune the first subset of the tunable delay circuits and the second subset of the tunable delay circuits in such a manner that a magnitude of a change of a combined delay of the first subset of tunable delay circuits caused by a given variation of the second delay tuning information differs from a magnitude of a change of a combined delay of the second subset of tunable delay circuits caused by the given variation of the second delay tuning information by no more than 20%, and
  wherein a sign of the change of the combined delay of the first subset of tunable delay circuits is opposite to a sign of the change of the combined delay of the second subset of tunable delay circuits.

5. The adjustable delayer according to claim 1, wherein the closed-loop control circuit is configured to provide the first delay tuning information to obtain a predetermined phase relationship between the input signal and a delayed version of the input signal that is provided at an output of the series-connected tunable delay circuits.

6. The adjustable delayer according to claim 1, wherein the adjustable delayer comprises a delay locked loop,
  wherein the delay locked loop comprises the closed-loop control circuit and the plurality of series-connected tunable delay circuits; and
  wherein the first delay tuning information is a control quantity of the delay locked loop.

7. The adjustable delayer according to claim 6, wherein the second delay tuning information is a disturbance quantity of the delay locked loop, and
  wherein the adjustable delayer is configured to introduce into the delay locked loop a compensation, in order to at least partially compensate for the disturbance quantity.

8. The adjustable delayer according to claim 7, wherein the closed loop control circuit is configured to receive the delay adjustment input information and use the delay adjustment input information in order to at least partially compensate for the disturbance quantity.

9. The adjustable delayer according to claim 8, wherein the adjustable delayer is configured to combine the delay adjustment input information with a phase detector reference signal or with a phase detector result signal or with an internal signal of a loop filter, in order to at least partially compensate for the disturbance quantity.

10. The adjustable delayer according to claim 1, wherein the adjustable delayer comprises a selector configured to select a tap of the plurality of series-connected tunable delay circuits based on the delay adjustment input information and provide the output signal on the basis of a signal present at the selected tap, to coarsely adjust a delay between the input signal and the output signal; and
  wherein the adjustable delayer is configured to vary the second delay tuning information based on the delay adjustment input information, to finely adjust the delay between the input signal and the output signal.

11. The adjustable delayer according to claim 1, wherein the closed-loop control circuit comprises a phase detector configured to compare a phase of the input signal with a phase of a delayed version of the input signal that is provided at an output or a tap of the plurality of series-connected tunable delay elements, and provide a phase detector result signal; and
  wherein the closed-loop control circuit comprises a loop filter configured to receive the phase detector result signal and provide, on the basis thereof, the first delay tuning information.

12. The adjustable delayer according to claim 11, wherein the adjustable delayer comprises a first digital combiner configured to add a value representing the second delay tuning information to a value representing the first delay tuning information, to obtain a first digital-to-analog converter input information; and
  wherein the adjustable delayer comprises a second digital combiner configured to subtract a value representing the second delay tuning information, or a positively scaled version thereof, from the value representing the first delay tuning information, to obtain a second digital-to-analog converter input information;
  wherein the adjustable delayer comprises a first digital-to-analog converter configured to provide a first analog control quantity for tuning a delay of a first subset of the tunable delay circuits on the basis of the first digital-to-analog converter input information and a second digital-to-analog converter configured to provide a second analog control quantity for tuning a delay of the second subset of the tunable delay circuits on the basis of the second digital-to-analog converter input information.

13. The adjustable delayer according to claim 1, wherein the tunable delay circuits are inverter stages or driver stages comprising a current limiter circuit,
  wherein the current limiter circuit is configured to adjustably limit an output current of the inverter stage or driver stage based on the combined delay tuning information.

14. The adjustable delayer according to claim 1, wherein the adjustable delayer is configured to derive the second delay tuning information from one or more least significant bits of the delay adjustment input information.

15. The adjustable delayer according to claim 1, wherein the adjustable delayer is configured to derive a coarse delay adjustment information from one or more most significant bits of the delay adjustment input information.

16. The adjustable delayer according to claim 1, wherein the adjustable delayer is configured to temporarily break a closed loop comprising the closed-loop control circuit, the series connection of a plurality of the tunable delay elements and the combiner; and
  wherein the adjustable delayer is configured to provide the output signal using a first subset of the tunable delay elements during a period of time in which the closed loop is broken, and
  wherein the adjustable delayer is configured to use the second subset of the tunable delay circuits for another functionality, other than providing the output signal, during the period of time in which the control loop is broken; and
  wherein the adjustable delayer is configured to re-establish a closed loop comprising the closed-loop control circuit, the series connection of the plurality of tunable delay circuits and the combiner after the temporary break of the closed loop, to thereby update the first delay tuning information.

17. The adjustable delayer according to claim 16, wherein the adjustable delayer is configured to periodically break the closed loop of the closed-loop control circuit.

18. The adjustable delayer according to claim 16, wherein the adjustable delayer is configured to determine or calibrate a gain of a delay adjustment of the tunable delay circuits during the period of time in which the closed loop is broken.

19. The adjustable delayer according to claim 18, wherein the adjustable delayer is configured to vary a delay of the tunable delay circuits of the second plurality of tunable delay circuits and to monitor a change of a phase of a signal provided using the tunable delay circuits of the second plurality of tunable delay circuits, to thereby obtain an information about a gain of the delay adjustment of the tunable delay circuits.

20. A method for delaying an input signal based on a delay adjustment input information describing a desired delay, to obtain an output signal, the method comprising:
providing a first delay tuning information to tune a combined delay of a plurality of tunable circuits, that are connected together in series, to fulfill a predetermined condition;
combining the first delay tuning information with a second delay tuning information, that is based on the delay adjustment input information, to obtain a combined delay tuning information;
tuning a delay of one or more of the tunable delay circuits based on the combined delay tuning information;
wherein the output signal is obtained on the basis of the input signal using one or more of the tunable delay circuits tuned based on the combined delay tuning information.

21. The method according to claim 20, wherein a first subset of the tunable delay circuits and a second subset of the tunable delay circuits are tuned such that delays of the tunable delay circuits of the first subset increase with increasing values of the second delay tuning information, and such that delays of the tunable delay circuits of the second subset reduce with increasing values of the second delay tuning information in the presence of a constant first delay tuning information.

22. The adjustable delayer according to claim 21, wherein the delays of the tunable delay circuits of the first subset and the delays of the tunable delay circuits of the second subset are tuned based on the second delay tuning information such that a combined delay of the first subset of tunable delay circuits and of the second subset of tunable delay circuits varies by less than 10% over a maximum variation range of the second delay tuning information.

23. The method according to claim 20, wherein the method further comprises selecting a tap of the series connection of the plurality of tunable delay circuits based on the delay adjustment input information and providing the output signal on the basis of a signal present at the selected tap, to coarsely adjust a delay between the input signal and the output signal; and
wherein the method comprises varying the second delay tuning information based on the delay adjustment input information, to finely adjust the delay between the input signal and the output signal.

24. The method according to claim 20, wherein the method comprises using a closed loop to provide the first delay tuning information, and wherein the method comprises temporarily breaking the closed loop,
wherein the output signal is provided using a first subset of the tunable delay circuits during a period of time in which the closed loop is broken, and wherein a second subset of the tunable delay circuits is used for another functionality, other than providing the output signal, during the period of time in which the closed loop is broken; and
wherein the method comprises re-establishing a closed loop to thereby update the first delay tuning information.

25. An adjustable delayer for adjustably delaying an input signal based on a delay adjustment input information describing a desired delay, to obtain an output signal, the adjustable delayer comprising:
a delay line comprising a first sub-delay line and a second sub-delay line connected in series;
a delay locked loop, wherein the first sub-delay line and the second sub-delay line are included in the delay locked loop,
a closed-loop control circuit configured to provide a first delay tuning signal to change delays of the first sub-delay line and of the second sub-delay line in the same direction in response to deviation of an actual phase shift between a reference signal and an output signal of the second sub-delay line from a predetermined target phase shift; and
a signal provider configured to provide a second delay tuning signal and a third delay tuning signal to change delays of the first sub-delay line and of the second sub-delay line in opposite directions based on the delay adjustment input information;
wherein the first sub-delay line is configured to receive the input signal; and
wherein the adjustable delayer is configured to provide the output signal on the basis of an output signal of the first sub-delay line or on the basis of a signal at a tap of the first sub-delay line, or
wherein the adjustable delayer is configured to provide the output signal on the basis of an output signal of the second sub-delay line or on the basis of a signal at a tap of the second sub-delay line.

26. The adjustable delayer according to claim 25, wherein the first sub-delay line and the second sub-delay line and the signal provider are configured such that an overall delay along the first sub-delay line and the second sub-delay line remains substantially constant, within a tolerance of 1%, over a full range of the delay adjustment input information.

27. A polar transmitter for providing a phase modulated output signal based on a phase modulation information, the polar transmitter comprising:
an oscillator configured to provide an unmodulated carrier signal or an incompletely modulated signal; and
an adjustable delayer configured to adjustably delay an input signal based on a delay adjustment input information describing a desired delay, to obtain an output signal, the adjustable delayer comprising:
a series connection of a plurality of tunable delay circuits, wherein a first of the tunable delay circuits is configured to receive the input signal;
a closed-loop control circuit configured to provide a first delay tuning information to tune a combined delay of the plurality of tunable delay circuits to fulfill a predetermined condition; and
a combiner configured to combine the first delay tuning information with a second delay tuning information, that is based on the delay adjustment input information, to obtain a combined delay tuning information;

wherein the adjustable delayer is configured to tune a delay of one or more of the tunable delay circuits based on the combined delay tuning information; and wherein the adjustable delayer is configured to provide the output signal based on one or more signals present at one or more outputs of one or more of the tunable delay circuits;

wherein the adjustable delayer is configured to receive the unmodulated or partially modulated carrier signal as the input signal;

wherein the adjustable delayer is configured to receive the phase modulation information as the second delay tuning information or to derive the second delay tuning information from the phase modulation information;

wherein the output signal of the adjustable delayer is the phase modulated output signal;

wherein the polar transmitter is configured to apply a phase modulation to the oscillator, such that the output signal of the oscillator, that is provided to an input of the adjustable delayer, is phase modulated based on the phase modulation information; and wherein the polar transmitter is configured to apply an additional phase modulation to the output signal of the oscillator using the adjustable based on the phase modulation information, to obtain the phase modulated output signal.

28. The polar transmitter according to claim 27, wherein the oscillator is part of a phase locked loop, and wherein the phase locked loop is adjusted based on the phase modulation information.

29. An adjustable delayer for adjustably delaying an input signal based on a delay adjustment input information describing a desired delay, to obtain an output signal, the adjustable delayer comprising:

a plurality of series-connected tunable delay circuits, wherein a first of the tunable delay circuits is configured to receive the input signal;

a closed-loop control circuit configured to provide a first delay tuning information to tune a combined delay of the plurality of tunable delay circuits to fulfill a predetermined condition; and a combiner configured to combine the first delay tuning information with a second delay tuning information that is based on the delay adjustment input information to obtain a combined delay tuning information;

wherein the adjustable delayer is configured to tune a delay of one or more of the tunable delay circuits based on the combined delay tuning information; and wherein the adjustable delayer is configured to provide the output signal based on one or more signals present at one or more outputs of one or more of the tunable delay circuits;

wherein the adjustable delayer is configured to tune a first subset of the tunable delay circuits and a second subset of the tunable delay circuits such that delays of the tunable delay circuits of the first subset increase with increasing values of the second delay tuning information and such that delays of the tunable delay circuits of the second subset of the tunable delay circuits reduce with increasing values of the second delay tuning information in the presence of a constant first delay tuning information;

wherein the adjustable delayer is configured to tune the first subset of the tunable delay circuits and the second subset of the tunable circuits such that delays of the tunable delay circuits of the first subset increase with increasing values of the first delay tuning information and such that delays of the tunable delay circuits of the second subset increase with increasing values of the first delay tuning information in the presence of a constant second delay tuning information;

wherein the adjustable delayer is configured to tune the first subset of the tunable delay circuits and the second subset of the tunable delay circuits in such a manner that a magnitude of a change of a combined delay of the first subset of tunable delay circuits caused by a given variation of the second delay tuning information differs from a magnitude of a change of a combined delay of the second subset of tunable delay circuits caused by the given variation of the second delay tuning information by no more than 20%, and wherein a sign of the change of the combined delay of the first subset of tunable delay circuits is opposite to a sign of the change of the combined delay of the second subset of tunable delay circuits;

wherein the adjustable delayer comprises a delay locked loop, wherein the delay locked loop comprises the closed-loop control circuit and the plurality of series-connected tunable delay circuits; and wherein the first delay tuning information is a control quantity of the delay locked loop;

wherein the adjustable delayer comprises a selector configured to select a tap of the series connection of the plurality of tunable delay circuits based on the delay adjustment input information and provide the output signal on the basis of a signal present at the selected tap, to coarsely adjust a delay between the input signal and the output signal; and wherein the adjustable delayer is configured to vary the second delay tuning information based on the delay adjustment input information, to finely adjust the delay between the input signal and the output signal.

30. A polar transmitter for providing a phase modulated output signal based on a phase modulation information, the polar transmitter comprising:

a variable phase oscillator configured to provide an incompletely modulated signal, wherein the variable phase oscillator is configured to adjust a phase of the incompletely modulated signal based on the phase modulation information or based on a component of the phase modulation information; and an adjustable delayer configured to adjustably delay the incompletely modulated signal based on the phase modulation information or based on a component of the phase modulation information, to obtain the phase modulated output signal.

31. The polar transmitter according to claim 30, wherein the polar transmitter is configured to apply a phase modulation to the variable phase oscillator, such that the output signal of the variable phase oscillator, that is provided to an input of the adjustable delayer, is phase modulated based on the phase modulation information, and wherein the polar transmitter is configured to apply an additional phase modulation to the output signal of the variable phase oscillator using the adjustable delayer based on the phase modulation information, to obtain the phase modulated output signal.

32. The polar transmitter according to claim 31, wherein the variable phase oscillator is part of a phase locked loop, and wherein the phase locked loop is adjusted based on the phase modulation information.

33. The polar transmitter according to claim 30, wherein the polar transmitter is configured to split a coarse phase modulation and a fine phase modulation between the variable phase oscillator and the adjustable delayer, such that one out of the variable phase oscillator and the adjustable delayer performs a coarse phase modulation and that the other out of the variable phase oscillator and the adjustable delayer performs a fine phase modulation.

* * * * *